(12) United States Patent
McCarthy

(10) Patent No.: US 9,087,611 B2
(45) Date of Patent: Jul. 21, 2015

(54) SYSTEM AND METHOD FOR INTEGRATED CIRCUIT MEMORY REPAIR WITH BINARY-ENCODED REPAIR CONTROL WORD

(71) Applicant: Avago Technologies General IP (Singapore) Pte. Ltd., Singapore (SG)

(72) Inventor: Donald F. McCarthy, Westminster, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 334 days.

(21) Appl. No.: 13/804,421

(22) Filed: Mar. 14, 2013

(65) Prior Publication Data

US 2014/0269122 A1   Sep. 18, 2014

(51) Int. Cl.
| | | |
|---|---|---|
| *G11C 29/12* | (2006.01) | |
| *G11C 29/04* | (2006.01) | |
| *G11C 29/00* | (2006.01) | |
| *G11C 29/44* | (2006.01) | |

(52) U.S. Cl.
CPC .............. *G11C 29/04* (2013.01); *G11C 29/785* (2013.01); *G11C 2029/4402* (2013.01)

(58) Field of Classification Search
CPC ........ G11C 29/14; G11C 29/12; G11C 29/40; G11C 29/44; G11C 29/56008; G11C 29/56016; G11C 29/56; G11C 29/787

USPC .................. 365/201, 200, 230.03, 225.7, 236, 365/230.06, 189.07, 189.12; 714/711, 710
See application file for complete search history.

(56) References Cited

U.S. PATENT DOCUMENTS

| | | | |
|---|---|---|---|
| 4,389,715 A * | 6/1983 | Eaton et al. .................... 714/711 |
| 7,376,025 B2 | 5/2008 | Merritt et al. |
| 7,839,707 B2 | 11/2010 | Aakjer |
| 7,895,482 B2 | 2/2011 | Fischer et al. |
| 8,055,956 B2 | 11/2011 | Dubey et al. |
| 8,537,627 B2 * | 9/2013 | Ouellette et al. .............. 365/200 |
| 8,929,165 B2 * | 1/2015 | Son et al. ....................... 365/200 |
| 2011/0029813 A1 | 2/2011 | Gunderson et al. |

OTHER PUBLICATIONS

Garg, et al., "Fuse Area Reduction based on Quantitative Yield Analysis and Effective Chip Cost," Proceedings of the 21st IEEE International Symposium on Defect and Fault-Tolerance in VLSI Systems (2006).

* cited by examiner

*Primary Examiner* — Andrew Q Tran

(57) ABSTRACT

Memory blocks in an integrated circuit (IC) chip can be repaired by employing automated test equipment external to the IC chip to aid in burning fuses on the IC chip by encoding the fuses with binary-encoded numbers. Each binary-encoded number represents a bit position of each "1" bit of a repair control word corresponding to a defective memory location. During a repair sequence preceding operation of the IC chip, the binary-encoded numbers are read out of the fuses and used to form a serial stream of repair chain information.

10 Claims, 4 Drawing Sheets

SYSTEM AND METHOD FOR INTEGRATED CIRCUIT MEMORY REPAIR WITH BINARY-ENCODED REPAIR CONTROL WORD

BACKGROUND

Integrated circuit (IC) memories commonly have manufacturing or fabrication defects due to undesirable variations in materials or processes over the surface of a semiconductor wafer or due to inadvertent damage to the wafer or IC during processing. Such defects result in localized impairment of IC functionality. The impairment is commonly limited to only a few rows or columns out of many thousands on the IC (or memory block of an IC having multiple blocks of memory). Therefore, rather than scrapping the entire IC or some other radical solution, so-called "repair" techniques have been developed to repair the defective rows or columns of memory by substituting a "spare" row or column for each defective row or column.

In accordance with some common repair techniques, the IC includes a group of fuses associated with a memory block. A fuse is a region on the IC die that can be configured or set to a state in which it encodes a binary bit (i.e., "1" or "0") in a non-volatile manner. Various types of fuses are known. For example, a common type of fuse comprises a metal region that can be reconfigured from a very low impedance to a very high impedance by briefly subjecting it to a relatively high voltage, thereby "blowing" or "burning" the fuse, as the effect is referred to in the art. The fuses can be burned to encode the information needed to repair the defective rows or columns. Each fuse commonly corresponds to exactly one bit of repair information. A number of bits of repair information, such as, for example, ten bits, may be needed to repair a memory block. That is, the repair logic requires this number of bits as an input to be able to properly substitute a spare row or column for a defective row or column in a particular memory block. The bits of repair information commonly provide the repair logic with information at least sufficient to identify a row or column, and may in some instances provide the repair logic with additional information.

Repairing IC memory blocks in a complex application-specific integrated circuit (ASIC) is hampered by the fact that memory blocks are distributed throughout the ASIC as part of numerous core logic blocks. A technique that has been developed to repair ASIC memory blocks involves what is known as a repair chain. A repair chain is a serial or daisy-chained arrangement of flip-flops. In an ASIC having, for example, 2,000 memory blocks, each having repair logic associated with it that requires ten bits of repair information as an input, the repair chain can have 20,000 flip-flops. Accordingly, the IC commonly has 20,000 fuses.

Each core logic block having at least one memory block includes a portion of the repair chain having a number of flip-flops equal to the number of bits of repair information required to repair the memory block. As part of the fabrication process, the defective rows or columns are identified, and the fuses are burned with corresponding repair information. Once burned with repair information in this manner, the ASIC can be included as part of an electronic system as though it had no defects. Each time the IC is powered up as part of the electronic system, repair control logic in the IC reads the repair information (bits) from the fuses and sequentially outputs the bits to the repair chain. That is, as each bit is read, the bit is shifted into, or becomes the next bit of, a serial data stream. Thus, in the foregoing example, 20,000 bits are read from the fuses and serially shifted into the 20,000 flip-flops of the repair chain. The repair logic in each core logic block having at least one memory block uses the bits of repair information stored in the group of flip-flops associated with that core logic block to substitute one or more spare rows or columns for the one or more defective rows or columns identified by those bits. The substitution commonly involves switching some signal paths from the defective row or column to the spare row or column by means of multiplexer-like logic. Once all fuses have been read and shifted into the repair chain, and the substitutions or repairs have been completed in this manner, the powered-up ASIC can operate normally, as though it had no defective memory locations.

Identifying defective rows or columns and producing the corresponding repair information can be accomplished in a number of ways. One way that has been described is to activate Built-In Self-Test (BIST) logic in the IC to test the memory blocks and activate repair control logic in the IC to burn fuses in accordance with the results of the self-test. External automated test equipment (ATE) can be connected to the IC to provide signals that activate the BIST logic and repair control logic. That is, the signals trigger the IC to test its memory blocks and burn its fuses in the manner described above.

The surface area of an IC die, colloquially referred to as "real estate," is a limited resource that must be allocated among competing potential uses. Fuses occupy real estate on the IC die that could otherwise be occupied by core logic, such as additional memory. While the time-honored scheme described above provides one fuse for every bit of repair information needed by the entire repair chain, techniques have been described for compressing the repair data such that it consists of fewer bits than the number of bits of repair information needed by the entire repair chain. In one such scheme, the compressed repair information that is stored in the fuses includes binary numbers encoded in a manner that identifies defective rows or columns.

SUMMARY

Embodiments of the present invention relate to an integrated circuit (IC) chip and method for repairing a memory in an IC chip, in which automated test equipment (ATE) external to the IC chip is used to aid in burning fuses on the IC chip by encoding the fuses with binary-encoded numbers. Each binary-encoded number represents a bit position of each "1" bit of a repair control word corresponding to a defective memory location.

In an exemplary embodiment, the IC chip includes self-test logic, a test access port (TAP), fuses, and fuse burn logic. The self-test logic is activated and produces information identifying one or more defective memory locations. The information identifying the one or more defective memory locations is communicated to the ATE via the TAP. The ATE determines a repair control word corresponding to each defective memory location and determines a binary-encoded number in response to a bit position of each "1" bit of each repair control word. The ATE then determines fuse burn information corresponding to the one or more binary-encoded numbers. The ATE communicates the fuse burn information corresponding to the one or more binary-encoded numbers to the IC chip via the TAP. The fuse burn logic is then activated and burns fuses of the one or more groups of fuses to encode the one or more binary-encoded numbers.

In the exemplary embodiment, after the fuses have been burned, fuse reading logic of the IC chip can read the fuses during a repair sequence. Counting logic of the IC chip successively increments a count during the repair sequence. Fuse decoding logic of the IC chip selects a group of M bits read from the fuses. Matching logic of the IC chip compares the M bits with the count and shifts a bit into a repair chain in association each time the count is incremented. If the comparison indicates that the M bits do not match the count, then the matching logic shifts a "0" bit into a repair chain. If the comparison indicates that the M bits match the count, then the matching logic shifts a "1" bit into the repair chain.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

DETAILED DESCRIPTION

Figure 1:
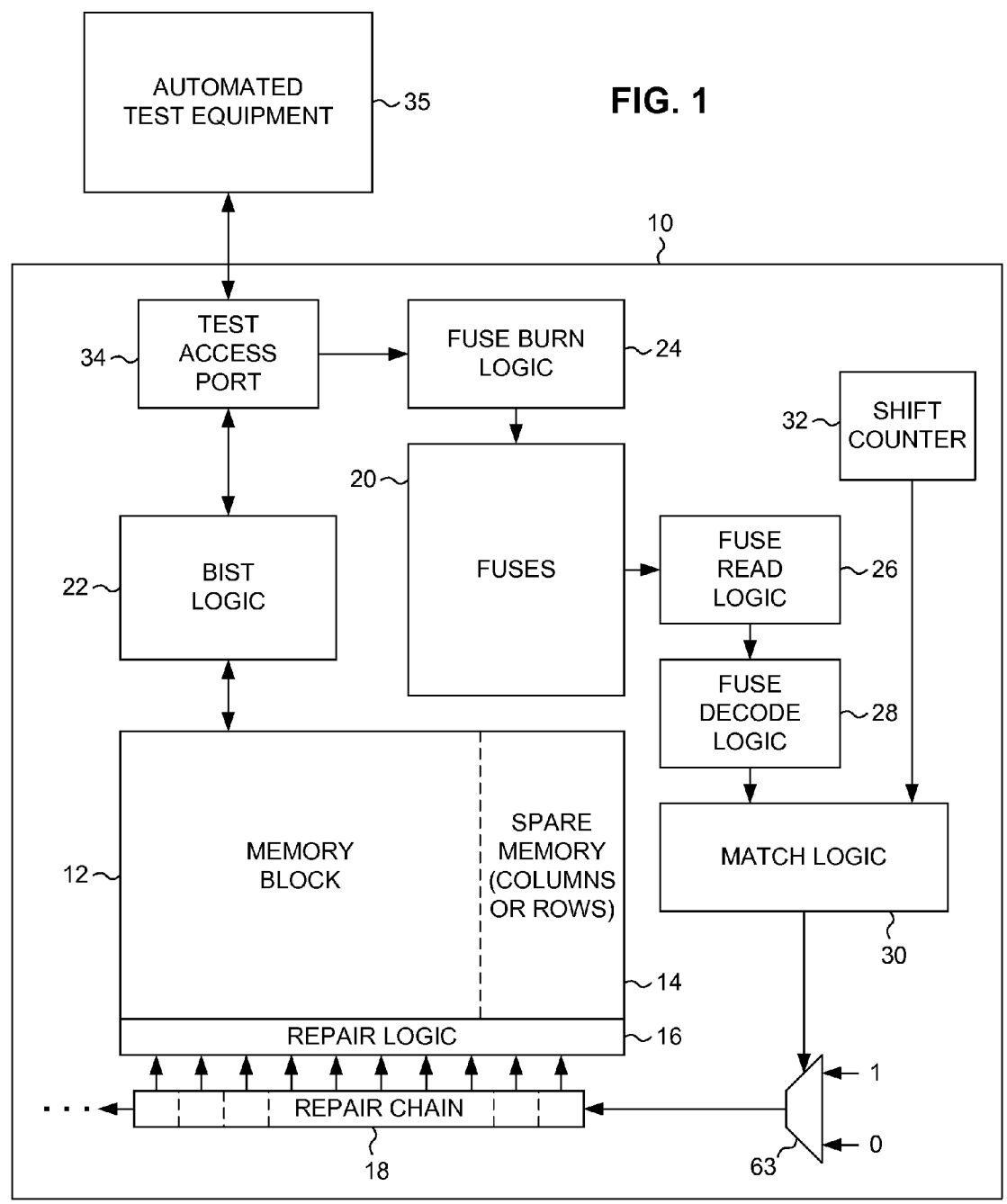
FIG. 1 is a block diagram of a system for integrated circuit memory repair, in accordance with an exemplary embodiment of the invention.

As illustrated in FIG. 1, in an illustrative or exemplary embodiment of the invention, an integrated circuit (IC) 10 includes: a memory block 12, spare memory 14, repair logic 16, a repair chain 18, fuses 20, Built-In Self-Test (BIST) logic 22, fuse burn logic 24, fuse read logic 26, fuse decode logic 28, match logic 30, a shift counter 32, and a test access port (TAP) 34. Memory block 12 can comprise any suitable type of random access memory. Memory block 12 has a conventional array-like configuration, with storage elements identified by their positions in rows and columns. As described below, when a defective storage element is identified through BIST logic 22, the entire row or, alternatively, the entire column, is replaced with a spare row or column.

Although not shown for purposes of clarity, memory block 12 can be one of many such memory blocks included in IC 10. Although similarly not shown for purposes of clarity, each such memory block can be included as part of a core logic block in IC 10. Such core logic blocks can be distributed about different regions of IC 10. As an example, there can be, say, 2,000 such core logic blocks and thus 2,000 memory blocks similar to memory block 12. Spare memory 14 includes columns or rows of memory of the same type as memory block 12. Spare memory 14 is integrated with memory block 12 in a conventional manner, through repair logic 16. Repair logic 16 can also be of a conventional type. As well understood by persons skilled in the art, in response to a repair control word (i.e., a binary number) provided as an input to repair logic 16, repair logic 16 substitutes a spare row or column for a row or column of memory block 12 that the repair control word identifies as defective. The repair control word provides repair logic 16 of a memory block 12 requiring repair with information at least sufficient to identify a row or column to be replaced.

Repair chain 18 comprises a number of flip-flops interconnected in daisy-chain or sequential fashion. Although not shown for purposes of clarity, repair chain 18 can be just a portion of a global (i.e., IC-wide) repair chain of such daisy-chained flip-flops that passes through each core logic block having a memory block that may need to be repaired. Repair information is loaded into the global repair chain (and thus repair chain 18) in a serial manner described below. Once repair chain 18 has been loaded in this manner, the flip-flops of repair chain 18 present a repair control word to repair logic 16. As an example, repair logic 16 can receive a 10-bit repair control word from the ten flip-flops of which repair chain 18 consists in such an example. Thus, in an exemplary embodiment in which IC 10 has 2,000 memory blocks 12, each receiving a 10-bit repair control word through a portion of the global repair chain, the total number of flip-flops in the global repair chain would be 20,000. Note that each of the 20,000 flip-flops or corresponding bits in the global repair chain can be identified by an index or bit position, ranging from 0 to 19,999 in this example. As repair logic 16 and the manner in which it interacts with memory block 12 and spare memory 14 are well understood by persons skilled in the art, such aspects are not described herein in further detail.

Fuses 20 can be of any suitable type, such as those which are conventionally included in ICs for the purpose of storing memory repair chain information. Conventionally, however, in an IC having a global repair chain with 20,000 flip-flops, 20,000 fuses would need to be included. In embodiments of the present invention, however, the number of fuses that need to be included is substantially less than the number of flip-flops in the global repair chain. The term of art "burn" is used herein for purposes of convenience to refer to the physical transformation that occurs in a fuse, but it should be understood that the term is not intended to limit the type of fuse or physical transformation.

Figure 2:
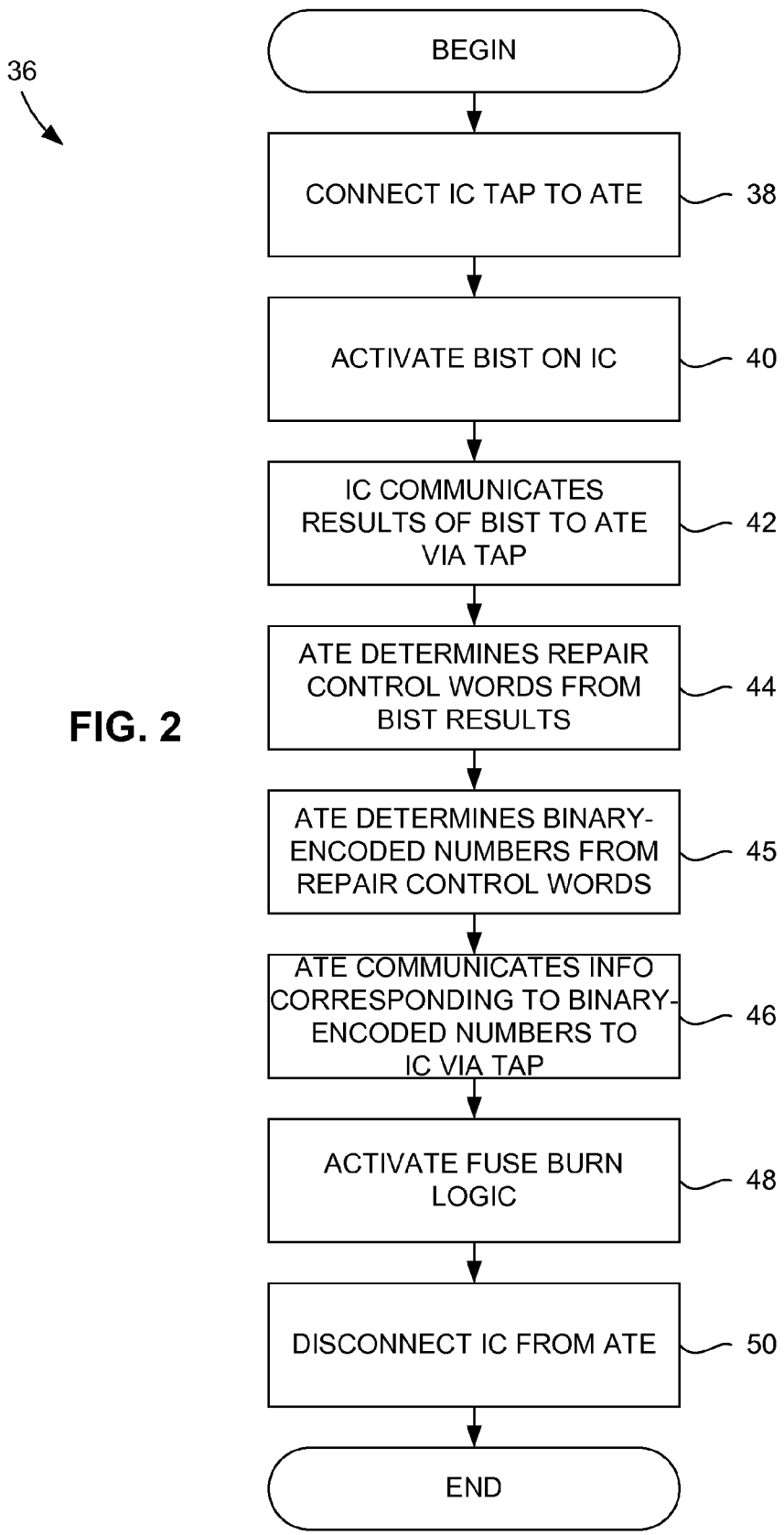
FIG. 2 is a flow diagram illustrating a method for integrated circuit memory repair, in accordance with the exemplary embodiment of the invention.

As illustrated in FIG. 2, a method 36 begins with coupling IC 10 to automated test equipment (ATE) 35 (FIG. 1) through TAP 34, as indicated by block 38. ATE 35 can include a suitable programmable test system. As indicated by block 40, BIST logic 22 is activated. BIST logic 22 can be activated by, for example, a command received from ATE 35 through TAP 34. BIST logic can be of a conventional type that, in response to being activated, tests all storage elements of memory block 12 and other such memory blocks (not shown) and produces information identifying one or more defective memory elements (i.e., identified by their memory locations or addresses). As indicated by block 42, BIST logic 22 outputs this information to ATE 35 through TAP 34. As indicated by block 44, ATE 35 uses this information to produce repair control words. Each repair control word corresponds to a defective memory location, such as a row or column. That is, each repair control word includes at least enough information to identify a row or column to be replaced.

As indicated by block 45, ATE 35 then determines a binary-encoded number in response to a bit position of each "1" bit of each repair control word in relation to the global repair chain. For example, in an instance in which a "1" bit of a repair control word occupies the, say, $257^{th}$ bit of a 20,000-bit global repair chain, ATE 35 produces the binary-encoded number '000000100000001' because the decimal number 257 is equivalent to the 15-bit binary number '000000100000001'. Note that the binary-encoded number is 15 bits wide to accommodate all 20,000 bit positions of the global repair chain. More generally, for a global repair chain having N bits or flip-flops, each binary-encoded number has M bits, where N is in the range between $2^M$ and $2^{M-1}$ inclusive. In the example above, each binary-encoded number needs 15 bits, because 20,000 is in the range between $2^{15}$ (or 32,768) and $2^{14}$ (or 16,384).

As indicated by block 46, ATE 35 outputs information corresponding to the binary-encoded numbers to fuse burn logic 24 via TAP 34. Such information can include the locations of the fuses (or other information identifying the fuses) that, when burned, will in combination with other (non-burned) fuses of an M-bit fuse group, represent a binary-encoded number. As indicated by block 48, fuse burn logic 24 burns fuses 20 to encode them with the binary-encoded numbers. That is, fuse burn logic 24 burns one or more groups of fuses 20 with the one or more binary-encoded numbers. Each group of M fuses is burned with one of the M-bit binary-encoded numbers.

Figure 4:
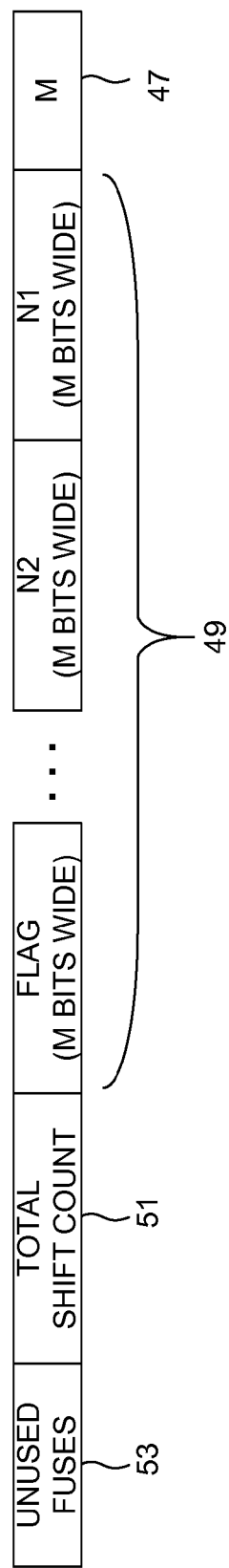
FIG. 4 is a schematic illustration of fuse locations in the IC.

Also, fuse burn logic 24 receives the number M from ATE 35 and burns one or more additional fuses such that they represent the number M. Referring briefly to FIG. 4, fuse burn logic 24 can do this before burning other fuses to represent the binary-encoded numbers. Thus, a fuse group 47 located in the first few fuse locations (for example, the first eight fuse locations) can be used to represent M. Successive fuse groups 49 following fuse group 47 can be used to represent the M-bit binary-encoded numbers (N1, N2, etc.). In addition, fuse burn logic 24 receives a total shift count from ATE 35 and burns one or more additional fuses such that still another fuse group 51 represents this total shift count. The number M and the total shift count are used as described below.

As indicated by block 50, IC 10 can be disconnected from ATE 35 after the fuses have been burned in this manner. IC 10 can then be incorporated into other circuitry (not shown) and operated as part of such other circuitry in a conventional manner.

Figure 3:
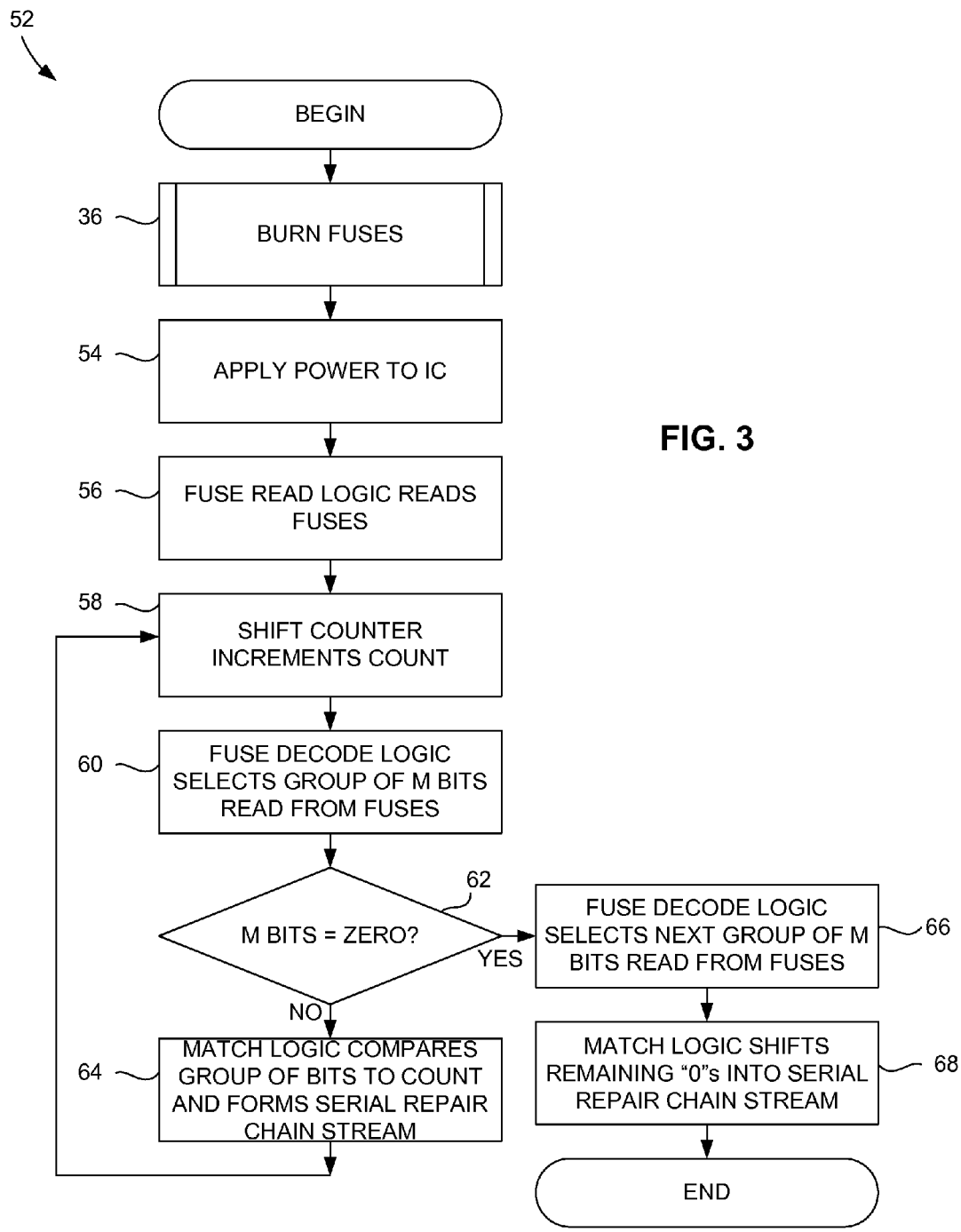
FIG. 3 is similar to FIG. 2, further illustrating a portion of the method occurring within the IC.

As illustrated in FIG. 3, a method 52 for repairing memory block 12 includes the above-described method 36 for burning fuses 20. In operation, power is applied to the circuitry of which IC 10 forms a part, as indicated by block 54. In the exemplary embodiment, the following logic operations or repair sequence occurs in response to such "power-up" of IC 10. Nevertheless, in other embodiments such a repair sequence can occur in response to a request or command provided by core logic of the IC or provided via the TAP. Fuse read logic 26 reads the binary-encoded numbers from fuses 20, as indicated by block 56. Fuse read logic 26 can read any suitable number of fuses 20 at a time, such as all of fuses 20 at once. Fuse decode logic 28 then selects a group of M bits that have been read from fuses 20 and provides that group of bits to match logic 30, as indicated by block 60. Before selecting the first group of M bits, fuse decode logic 28 can determine the number M by reading fuse group 47 (FIG. 4) as described above. Fuse decode logic 28 causes this selection to occur repeatedly, in association with shift counter 32 incrementing a count, as indicated block 58 and by the arrow indicating a process flow from block 64 back to block 58.

As indicated by block 62, fuse decode logic 28 determines whether the selected group of M bits has a value of zero. A fuse group encoded with all "0"s (i.e., a value of zero) serves as a flag that indicates the boundary of fuses that have been burned. Referring briefly to FIG. 4, a fuse group 49 is encoded with all "0"s (i.e., the flag) because it immediately follows the last of the successive fuse groups 49 that represent the M-bit binary-encoded numbers.

If fuse decode logic 28 determines that the selected group of M bits does not have a value of zero, then the process continues at block 64. Using multiplexing logic 63 (FIG. 1) or similar selection logic, match logic 30 outputs a serial stream of bits. The above-described count corresponds to the bit position or index of each bit in the global repair chain. Each time (e.g., on each clock cycle) that fuse decode logic 28 selects such a group of M bits that have been read from fuses 20, match logic 30 compares the group of M bits with the count. If match logic 30 determines that the group of M bits does not match the count, then match logic 30 causes multiplexing logic 63 to select a "0" bit to be inserted into the serial bit stream, as indicated by block 64. If match logic 30 determines that the group of M bits matches the count, then match logic 30 causes multiplexing logic 63 to select a "1" bit to be inserted into the serial bit stream, as also indicated by block 64. As this serial bit stream is formed, it is serially shifted into the global repair chain, including the portion represented by repair chain 18.

If fuse decode logic 28 determines that the selected group of M bits has a value of zero (i.e., the flag), the repair sequence ends after match logic 30 and multiplexing logic 63 shift the remaining "0" bits into the serial bit stream. The remaining "0" bits refers to the bits that need to be included in the serial bit stream so that the total number of bits in the serial bit stream is N (i.e., the total number of bits in the global repair chain). As indicated by block 66, and with reference again to FIG. 4, fuse decode logic 28 reads the next group of M bits following the flag. This next group of M bits is a total shift count value, represented by fuse group 51 in FIG. 4. The remaining fuses 53 are unused. As indicated by block 68, match logic 30 causes multiplexing logic 63 to output a number of further "0" bits (i.e., the remaining "0" bits) equal to the total shift count value. For example, control shift counter 32 (FIG. 1) can include control logic (not separately shown for purposes of clarity) that causes it to stop incrementing when the count equals the total shift count value.

Note that the order in which the blocks in FIGS. 2 and 3 are shown is provided only for clarity of description, and is not intended to be restrictive of the order in which logic operations can occur in IC 10 or steps of the method can be performed. For example, some logic operations can occur at the same time as others. Although not shown for purposes of clarity, fuse read logic 26, fuse decode logic 28, match logic 30, and shift counter 32 can operate synchronously with a clock signal. Also note that although shift counter 32 is incremented in this exemplary embodiment, the term "incrementing" is intended to encompass the alternative of decrementing in other embodiments.

Fuse read logic 26 and fuse decode logic 28 read and decode successive groups of M bits until all of the fuse groups 49 (FIG. 4) have been decoded, as determined at block 62 in the manner described above. When the repair sequence ends, the global repair chain has been fully loaded with the repair information. That is, each portion of the global repair chain that provides a repair control word to a memory block having a defective memory element has been loaded with the repair control word needed by the repair logic to perform the repair (e.g., substitute a spare row or column for the defective row or column).

In response to the repair control word that has been loaded into repair chain 18, repair logic 16 substitutes a spare memory location (i.e., column or row) for a defective memory location in memory block 12. As the manner in which repair logic 16 effects this substitution though a switching or multiplexing-like operation is well understood by persons skilled in the art, such aspects are not described herein.

Note that the number of fuses 20 that are included in IC 10 need only be sufficient to encode the number of groups of M bits needed to represent the bit positions of all "1" bits of all repair control words corresponding to defective memory locations. A repair control word consisting of all "0"s indicates that no repair is to be performed. Therefore, the number of "1" bits collectively included among all repair control words dictates the minimum number of fuses 20 that need to be included in IC 10. In an IC 10 manufactured using common manufacturing methods, only a small percentage of memory locations are likely to be found defective. For example, if empirical testing reveals that IC 10 can be manufactured consistently with fewer than, say, eight defective columns, only a number of fuses 20 sufficient to encode repair control words for eight columns need be provided. For example, in an exemplary instance in which no more than eight columns among the various memory blocks in IC 10 can be expected to be defective and in which the repair control word provided to each memory block has ten bits (i.e., M=10), then fuses 20 need encode no more than 80 binary-encoded numbers. As the length of the global repair chain (i.e., the number of flip-flops) is 20,000 in this example, fuses 20 need to be configurable to encode 20,000 binary-encoded numbers. To encode 20,000 binary-encoded numbers as binary numbers, each binary-encoded number needs to be at least 15 bits wide. Therefore, 80×15 or 1,200 fuses 20 need to be included on IC 10 in this example. This is advantageous because 1,200 fuses 20 is significantly fewer than the 20,000 fuses that would be included in an IC that uses the most common conventional repair method.

It should be noted that in accordance with common IC fabrication techniques, such as the use of macro cells, storage elements such as fuses are commonly included in quantities that are integer multiples of a power of two. Fuses 20 may be included not only in power-of-two quantities but in blocks of a fixed quantity, such as 1,024. Thus, in an instance in which, say, 1,200 fuses 20 are needed, two fuse blocks of 1,024 fuses each would be included, providing a total of 2,048 fuses. Of the 2,048 fuses, only 1,200 would be burned in the example above. Up to nearly 2,048 fuses could be used if required.

It should be noted that the invention has been described with respect to illustrative embodiments for the purpose of describing the principles and concepts of the invention. The invention is not limited to these embodiments. As will be understood by those skilled in the art in view of the description being provided herein, many modifications may be made to the embodiments described herein without deviating from the goals of the invention, and all such modifications are within the scope of the invention.

What is claimed is:

1. A method for repairing a memory in an integrated circuit (IC) chip, the IC chip comprising a plurality of memory locations, self-test logic, a test access port, a plurality of fuses, and fuse burn logic, the method comprising:
   activating the self-test logic to produce information identifying one or more defective memory locations;
   communicating the information identifying the one or more defective memory locations to an automated test equipment via the test access port;
   the automated test equipment determining a repair control word corresponding to each defective memory location in response to the information identifying the one or more defective memory locations;
   the automated test equipment determining a binary-encoded number in response to a bit position of each "1" bit of each repair control word;
   the automated test equipment communicating fuse burn information corresponding to one or more binary-encoded numbers to the IC chip via the test access port; and
   activating the fuse burn logic to burn one or more fuses to encode the one or more binary-encoded numbers.

2. The method of claim 1, wherein a repair chain of the IC has a length of N bits, the plurality of fuses includes one or more fuse groups, and each fuse group encodes an M-bit binary-encoded number, where N is in a range between $2^M$ and $2^{M-1}$ inclusive.

3. The method of claim 2, wherein activating the fuse burn logic further comprises activating the fuse burn logic to burn one or more fuses to encode M as a number.

4. The method of claim 2, further comprising:
   fuse reading logic of the IC chip reading the fuses during a repair sequence;
   counting logic of the IC chip successively incrementing a count during the repair sequence;
   fuse decoding logic of the IC chip selecting a group of M bits read from the fuses; and
   matching logic of the IC chip comparing the M bits with the count and shifting a bit into a repair chain in association with each incrementing of the count, the matching logic shifting a "0" bit into a repair chain if the M bits do not match the count and shifting a "1" bit into the repair chain if the M bits match the count.

5. An integrated circuit (IC) chip having a system for repairing a memory, comprising:
   at least one memory block comprising a plurality of memory locations;
   at least one spare memory location;
   a plurality of fuses;
   a repair chain having a length of N bits;
   self-test logic configured to test the at least one memory block and produce information identifying one or more defective memory locations;
   fuse burn logic configured to burn one or more fuses of the plurality of fuses to encode one or more M-bit binary-encoded numbers, where N is in a range between $2^M$ and $2^{M-1}$ inclusive, each binary-encoded number representing a bit position of each "1" bit of a repair control word corresponding to a defective memory location;
   fuse reading logic configured to read the fuses during a repair sequence;
   counting logic configured to successively increment a count during the repair sequence;
   fuse decoding logic configured to select a group of M bits read from the fuses; and
   matching logic configured to compare the M bits with the count and shift a bit into a repair chain in association with each incrementing of the count, the matching logic configured to shift a "0" bit into the repair chain if the M bits do not match the count and shift a "1" bit into the repair chain if the M bits match the count.

6. The IC chip of claim 5, further comprising a test access port, wherein the self-test logic is further adapted to provide the information identifying one or more defective memory locations to the test access port, and the fuse burn logic is further adapted to receive the one or more binary-encoded numbers via the test access port.

7. The IC chip of claim 6, wherein the fuse burn logic is further adapted to burn one or more fuses of the plurality of fuses to encode M as a number.

8. A method for memory repair in an integrated circuit (IC) chip, the IC chip having a plurality of memory locations, a plurality of fuses, and a repair chain having a length of N bits, the method comprising:
   self-test logic testing at least one memory block and producing information identifying one or more defective memory locations;
   fuse burn logic burning one or more fuses of the plurality of fuses to encode one or more M-bit binary-encoded numbers, where N is in a range between $2^M$ and $2^{M-1}$ inclusive, each binary-encoded number representing a bit position of each "1" bit of a repair control word corresponding to a defective memory location;

fuse reading logic reading the fuses during a repair sequence;

counting logic successively incrementing a count during the repair sequence;

fuse decoding logic selecting a group of M bits read from the fuses; and matching logic comparing the M bits with the count and shifting a bit into a repair chain in association with each incrementing of the count, the matching logic shifting a "0" bit into the repair chain if the M bits do not match the count and shifting a "1" bit into the repair chain if the M bits match the count.

9. The method of claim 8, further comprising:

providing the information identifying one or more defective memory locations to the test access port; and receiving the one or more binary-encoded numbers via the test access port.

10. The method of claim 8, wherein the fuse burn logic further burns one or more fuses of the plurality of fuses to encode M as a number.

\* \* \* \* \*